United States Patent
Zhou

(10) Patent No.: US 10,896,894 B2
(45) Date of Patent: Jan. 19, 2021

(54) WAFER-LEVEL METHODS OF FABRICATING SEMICONDUCTOR DEVICE PACKAGES AND RELATED PACKAGES

(71) Applicant: Micron Technology, Inc., Boise, ID (US)

(72) Inventor: Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 16/150,061

(22) Filed: Oct. 2, 2018

(65) Prior Publication Data
US 2020/0105713 A1 Apr. 2, 2020

(51) Int. Cl.
*H01L 23/00* (2006.01)
*H01L 21/20* (2006.01)
*B23K 20/02* (2006.01)

(52) U.S. Cl.
CPC ............ *H01L 24/95* (2013.01); *B23K 20/023* (2013.01); *H01L 21/2007* (2013.01); *H01L 24/14* (2013.01); *H01L 24/81* (2013.01); *H01L 2224/16227* (2013.01); *H01L 2224/81815* (2013.01); *H05K 2203/0475* (2013.01)

(58) Field of Classification Search
CPC .............................. H01L 24/95; B23K 20/023
See application file for complete search history.

(56) References Cited

U.S. PATENT DOCUMENTS

| 2009/0206447 A1* | 8/2009 | Basker | H01L 21/2885 |
| | | | 257/530 |
| 2017/0287921 A1* | 10/2017 | Lu | H01L 21/76224 |

\* cited by examiner

*Primary Examiner* — Lex H Malsawma
*Assistant Examiner* — Xia L Cross
(74) *Attorney, Agent, or Firm* — TraskBritt

(57) ABSTRACT

Methods of fabricating semiconductor device packages may involve forming trenches in a first wafer. A dielectric material may be placed over a first active surface. Electrically conductive elements may be operatively connected to bond pads of a second wafer with the dielectric material interposed between the first wafer and the second wafer. Force may be applied to the first wafer and the second wafer while exposing the first wafer and the second wafer to an elevated temperature. Portions of the dielectric material may flow into the trenches. The elevated temperature may be reduced to at least partially solidify the dielectric material. A thickness of the first wafer may be reduced to reveal the portions of the dielectric material in the trenches. The first wager may be singulated and the second wafer may be singulated to form semiconductor dice.

19 Claims, 4 Drawing Sheets

WAFER-LEVEL METHODS OF FABRICATING SEMICONDUCTOR DEVICE PACKAGES AND RELATED PACKAGES

FIELD

This disclosure relates generally to wafer-level methods of processing, handling, and packaging semiconductor devices. More specifically, disclosed embodiments relate to wafer-level methods of processing, handling, and packaging multiple semiconductor devices that may reduce cost, increase yield, and speed throughput.

BACKGROUND

It is a general trend in the electronics industry to decrease the size of components while increasing the bandwidth of those components. For example, chip-on-wafer techniques may generally eliminate relatively tall or thick electrically conductive elements, such as solder bumps, between the bond pads of individual semiconductor dice and a wafer in favor of smaller electrically conductive elements such as copper pillars and terminal pads, facilitated by thermocompression bonding.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
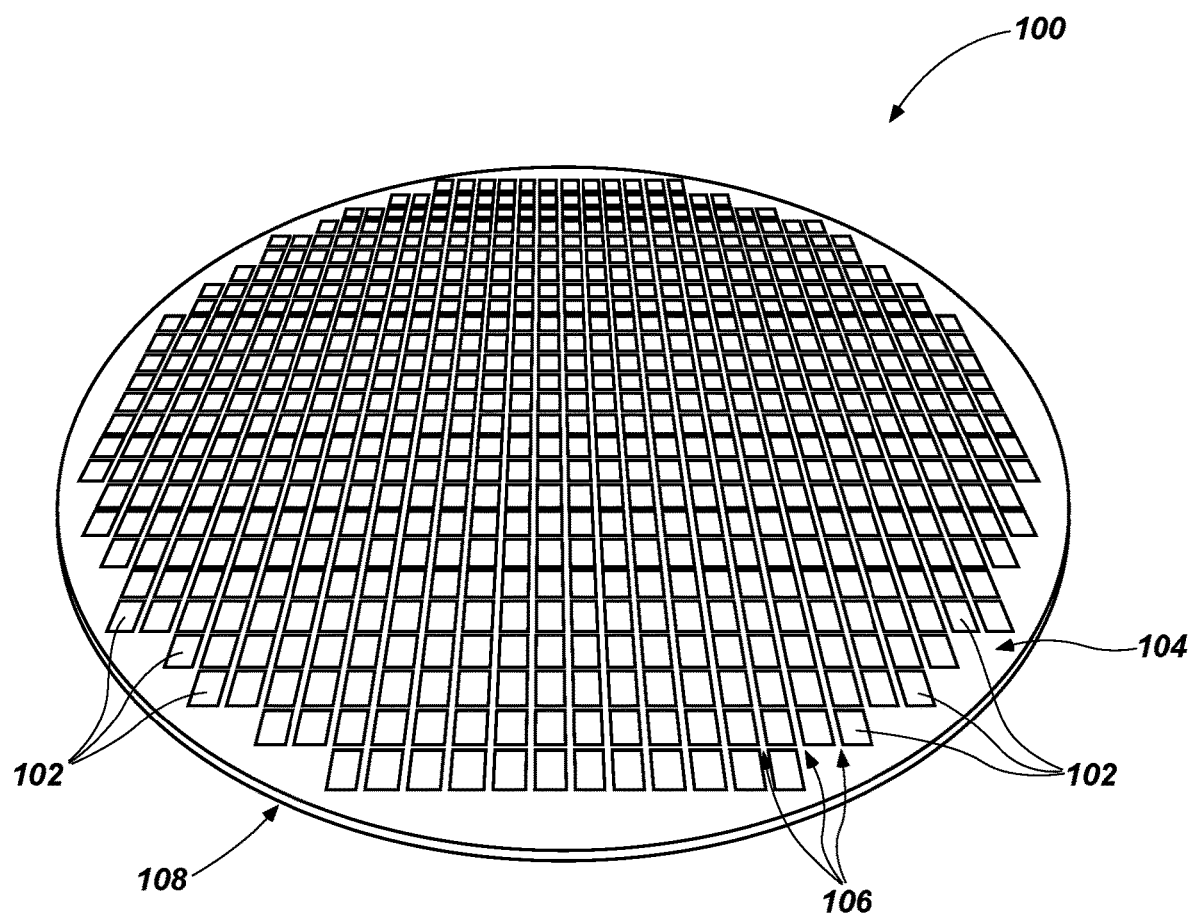
FIG. 1 is a perspective top view of a wafer.

The illustrations presented in this disclosure are not meant to be actual views of any particular act in a method of processing, handling, or packaging semiconductor device, semiconductor device itself, semiconductor package, or component thereof, but are merely idealized representations employed to describe illustrative embodiments. Thus, the drawings are not necessarily to scale.

Disclosed embodiments relate generally to wafer-level methods of processing, handling, and packaging semiconductor devices that may reduce cost, increase yield, and speed throughput. More specifically, disclosed are embodiments of processing, handling, and packaging semiconductor devices at the wafer level that may involve the sequential formation of trenches in an overlying wafer, placement of dielectric material between the overlying wafer and an underlying wafer, application of force and heat to electrically connect respective regions of integrated circuitry of adjacent wafers and cause the dielectric material to flow into the trenches, and ultimate separation of the connected regions from other connected regions to form semiconductor device packages. By adapting chip-on-wafer techniques, such as thermocompression bonding, to wafer-level handling and assembly techniques, such as the adaptations summarized above, and described in greater detail and supplemented below, wafer-to-wafer assembly may reduce, or eliminate, the need for costly, potentially damaging, and time-consuming chip-level techniques, such as, for example, pick-and-place application of individual semiconductor dice over an entire wafer.

As used in this disclosure, relative terms based on orientations depicted in the figures, such as "upper," "lower," "top," "bottom," "over," and "under," refer to the orientation depicted in the associated figures, and are not meant to limit the orientation of the device during fabrication or use. For example, an upper surface refers to the upper surface depicted in the associated drawing, but the same surface may ultimately be oriented sideways, downward, or at an angle during fabrication or use of the device.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, the terms "conductive element" and "electrically conductive element" mean and include a metal or metal alloy material, for example a solder, susceptible to heat-induced reflow at a temperature between, for example, about 90° C. and about 450° C. The metal or metal alloy material of the conductive element may be in a solid state, or as a mass of metal particles in a binder in the form of a paste. The conductive element may be carried on another conductive structure, such as a bond pad, or on a pillar or stud of a higher melting point metal material.

FIG. 1 is a perspective top view of a first wafer 100. The first wafer 100 may comprise a semiconductor material (e.g., silicon) to be further processed into a plurality of semiconductor devices (i.e., semiconductor dice). The first wafer 100 may be of any shape, such as, for example, at least substantially disc-shaped or at least substantially a rectangular prism. The first wafer 100 may include discrete first regions 102 of integrated circuitry embedded within, and distributed over, the first active surface 104 of the first wafer 100, each discrete first region 102 of integrated circuitry being laterally separated from other first regions 102 by first streets 106. A first backside surface 108 of the first wafer 100, which may lack integrated circuitry embedded therein, may be located on a side of the first wafer 100 opposite the active first surface 104. First wafer 100 may be cut (i.e., singulated) to form individual semiconductor device packages. In some embodiments, the first wafer 100 may comprise only semiconductor material (e.g., silicon) and be configured conventionally as a disc with a flat or notch on one side for alignment purposes.

Figure 2:
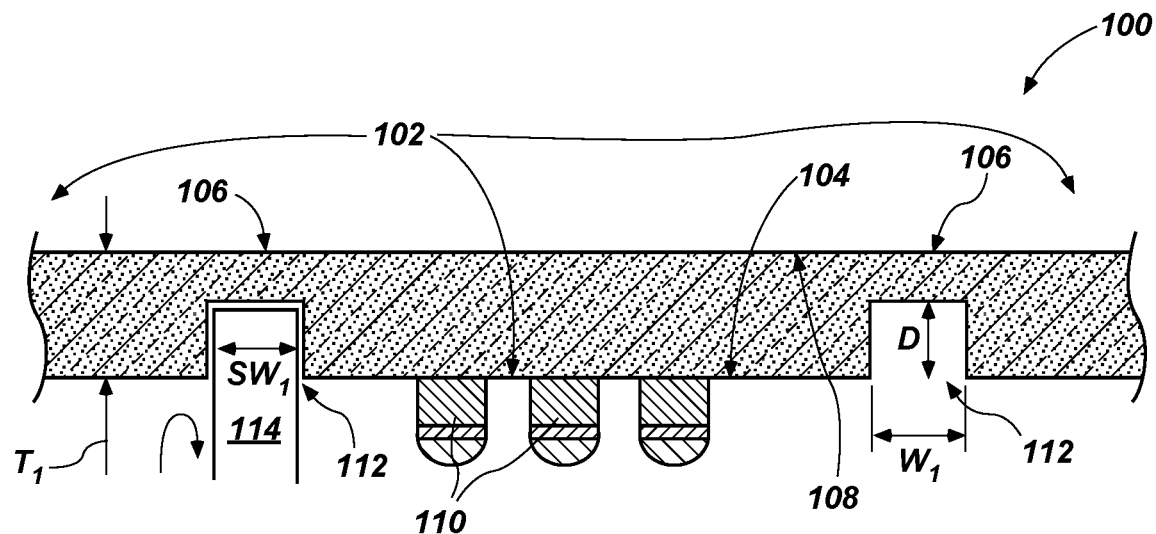
FIG. 2 is a cross-sectional side view of a portion of the wafer of FIG. 1 during a first stage in a process of fabricating semiconductor device packages.

FIG. 2 is a cross-sectional side view of a portion of the first wafer 100 of FIG. 1 during a first stage in a process of fabricating semiconductor device packages. The first wafer 100 may be the first wafer 100 processed in accordance with the methods of this disclosure, and may be configured to form a top-most first wafer 100 during processing, and the top-most die in a stack of dice of semiconductor device packages formed in accordance with this disclosure. First electrically conductive elements 110 may be positioned on, and extend outward from, the first active surface 104, and may be located on each of the first regions 102 of integrated circuitry (e.g., in a repeating, geometric pattern distributed over the first active surface 104) to provide operative, electrical connection to the integrated circuitry in the respective first regions 102. First electrically conductive elements 110 may be configured, as shown as copper pillars topped with a solder cap and a nickel barrier material between the copper and the solder. In another embodiment, first electrically conductive elements 110 may be configured only as copper pillars. The first wafer 100 may have a first thickness $T_1$, which may represent a maximum, unthinned state of the first wafer 100, for example about 650 µm to about 750 µm.

First trenches 112 may be formed in the first streets 106 located between the first regions 102 of integrated circuitry in the first active surface 104 of the first wafer 100. Although the cross-sectional view of FIG. 2 is only able to show the first trenches 112 running parallel to one another along certain first streets 106, the first trenches 112 may extend along the first streets 106 in each direction, forming a grid of the first trenches 112 around at least some of the first regions 102 of integrated circuitry, up to surrounding each of the first regions 102 and running along each of the first streets 106. Though the cross-sectional shape of the first trenches 112 depicted in FIG. 2 is at least substantially rectangular, any cross-sectional shape may be used, though having at least a portion of the first trenches 112 beginning at the first active surface 104 and extending toward the first backside surface 108 include at least substantially straight sidewalls oriented at least substantially perpendicular to the first active surface 104 may be desirable. For example, the cross-sectional shape of the first trenches 112, as viewed in a plane perpendicular to an edge between a sidewall of the first trenches 112 and the first active surface 104, may be at least substantially rectangular with rounded corners, a half-round bottom, etc.

The first trenches 112 may extend only partially through the first thickness $T_1$ of the first wafer 100, and may be of a first width $W_1$ sufficiently small that the integrated circuitry in the first regions 102 located laterally adjacent to the first trenches 112 has a low likelihood of being damaged due to the formation of the first trenches 112. For example, the first trenches 112 may extend in a direction perpendicular to the first active surface 104, from the first active surface 104 to between about 20% and about 80% of the first thickness $T_1$ of the first wafer 100. More specifically, the first trenches 112 may extend from the first active surface 104 to between about 30% and about 70% of the first thickness $T_1$ of the first wafer 100. As a specific, nonlimiting example, the first trenches 112 may extend from the first active surface 104 to between about 40% and about 60% (e.g., about 50%, 55%, or 60%) of the first thickness $T_1$ of the first wafer 100. A depth D of the first trenches 112, as measured in a direction perpendicular to the first active surface 104, may be, for example, between about 100 µm and about 500 µm. More specifically, the depth D of the first trenches 112 may be between about 200 µm and about 400 µm. As a specific, nonlimiting example, the depth D of the first trenches 112 may be between about 250 µm and about 350 µm (e.g., about 300 µm). The first width $W_1$ of the first trenches 112 may occupy, for example, between about 20% and about 80% of the shortest lateral extents of the first streets 106 between the first regions 102 of integrated circuitry of the first wafer 100. More specifically, the first width $W_1$ of the first trenches 112 may occupy, for example, between about 30% and about 70% of the lateral extents of the first streets 106. As a specific, nonlimiting example, the first width $W_1$ of the first trenches 112 may occupy between about 40% and about 60% (e.g., about 50%, 55%, or 60%) of the lateral extents of the first streets 106. The first width $W_1$ of the first trenches 112 may be, for example, between about 50 µm and about 150 µm. More specifically, the first width $W_1$ of the first trenches 112 may be, for example, between about 55 µm and about 100 µm. As a specific, nonlimiting example, the first width $W_1$ of the first trenches 112 may be between about 60 µm and about 80 µm (e.g., about 70 µm or 75 µm).

The first trenches 112 may be formed, for example, by removing semiconductor material of the first wafer 100 from within the first streets 106, such as, for example, by cutting or etching (e.g., dry or wet) the semiconductor material of the first wafer 100. As a specific, nonlimiting examples, the first trenches 112 may be formed by partially cutting through the first thickness $T_1$ of the first wafer 100 utilizing a first dicing saw 114 having a first saw width $SW_1$ sized and shaped to produce the first trenches 112 of the first width $W_1$, or by performing a first number of dicing passes utilizing the first dicing saw 114 sufficient to produce the first width $W_1$.

Figure 3:
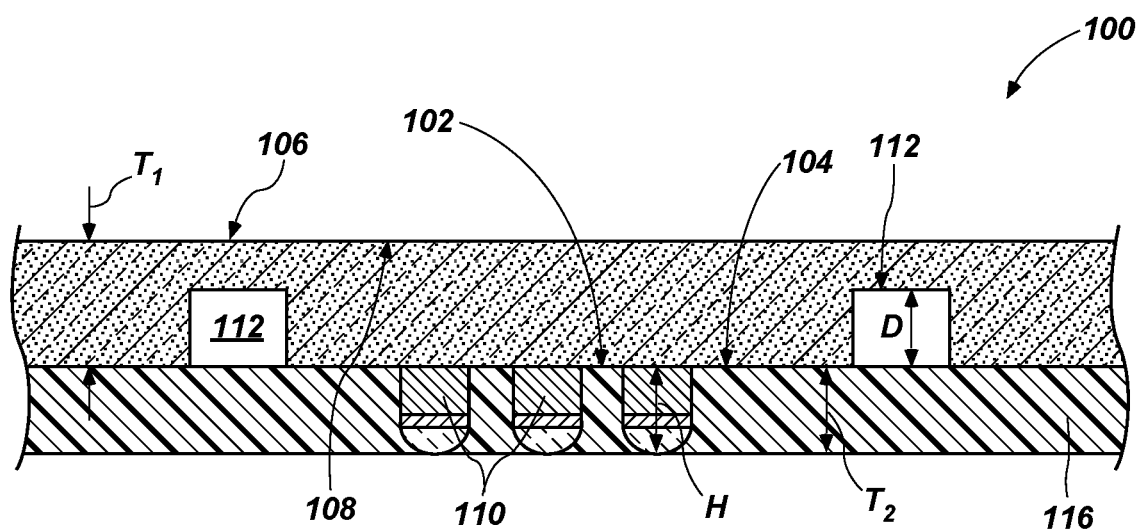
FIG. 3 is a cross-sectional side view of the portion of the wafer of FIG. 2 during a second stage in the process of fabricating semiconductor device packages.

FIG. 3 is a cross-sectional side view of the portion of the first wafer 100 of FIG. 2 during a second stage in the process of fabricating semiconductor device packages. A first quantity of a dielectric material 116 may be placed over the first active surface 104, at least partially surrounding the first electrically conductive elements 110 located on the first active surface 104 with the first quantity of the dielectric material 116. A second thickness $T_2$ of the dielectric material 116 may be at least substantially equal to, or slightly greater or less than, a maximum height H of the first electrically conductive elements 110 above the first active surface 104. The first trenches 112 may remain at least substantially free of the first quantity of the dielectric material 116, such that the dielectric material 116 may extend over the first trenches 112 between the first regions 102 of integrated circuitry in the first active surface 104, and the first trenches 112 may remain primarily occupied by environmental fluid (e.g., air or an inert gas, such as argon).

The dielectric material 116 may include, for example, a non-conductive polymer material. More specifically, the dielectric material 116 may include, for example, a nonconductive film (NCF), and may be initially deposited in an uncured state, over and around first electrically conductive elements 110. As another specific, nonlimiting example, the dielectric material 116 may be dispensed in a flowable state, for example as by spin coating, over the first active surface 104 and around at least portions of the first electrically conductive elements 110 for subsequent curing.

Figure 4:
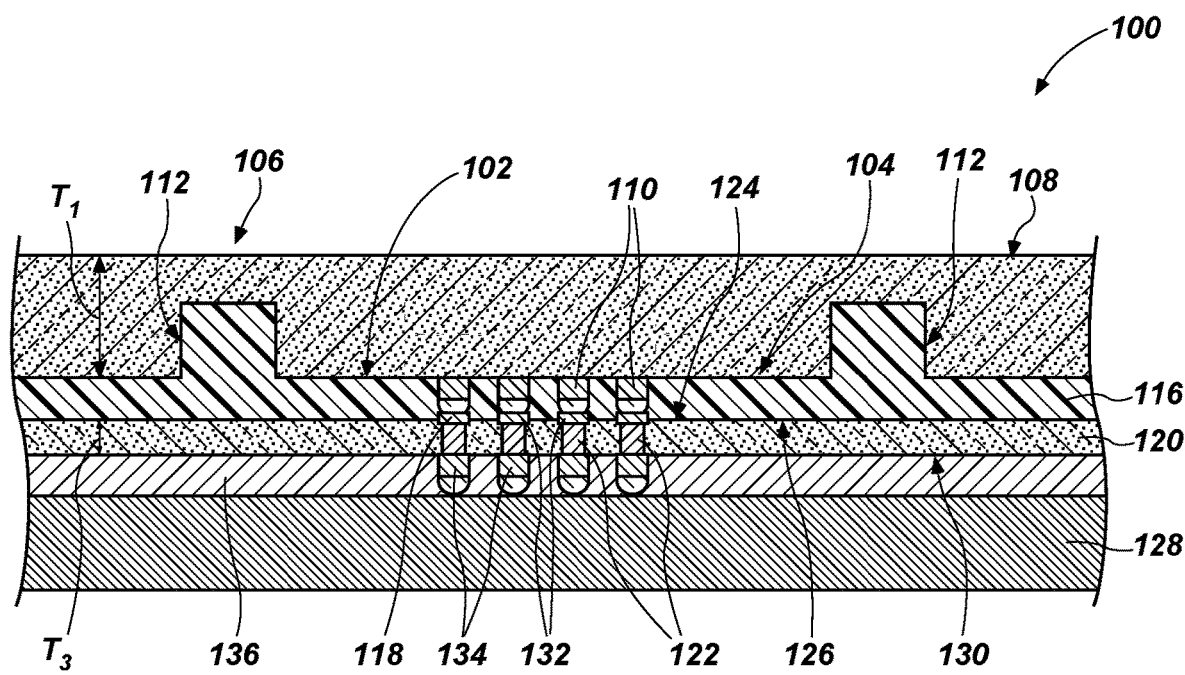
FIG. 4 is a cross-sectional side view of the portion of the wafer of FIG. 3 during a third stage in the process of fabricating semiconductor device packages.

FIG. 4 is a cross-sectional side view of the portion of the wafer of FIG. 3 during a third stage in the process of fabricating semiconductor device packages. A second wafer 120 comprising a semiconductor material may be brought proximate to, and placed in contact with, the dielectric material 116 on a side of the dielectric material 116 opposite the first wafer 100. The second wafer 120 may generally be configured in a manner similar to the first wafer 100, including having a second active surface 126 facing the first active surface 104 of the first wafer 100 and a second backside surface 130 located on a side of the second wafer 120 opposite the second active surface 126 and the first wafer 100. The second active surface 126 may include discrete, second regions 124 of integrated circuitry embedded within, and distributed across, the second active surface 126. The second regions 124 of integrated circuitry may be operatively, electrically connected to second vias 122 extending from at least proximate to the second active surface 126, through semiconductor material of the second wafer 120 in a direction at least substantially perpendicular to the second active surface 126, to at least proximate to the second backside surface 130. The second wafer 120 may enable electrical and operative connection to the second regions 124 of integrated circuitry, and between the second active surface 126 and the second backside surface 130 utilizing, for example, bond pads 132 connected to the second vias 122 at the second active surface 126 and second electrically conductive elements 134 positioned on, and extending outward from, the second vias 122 at the second backside surface 130.

The second wafer 120 may be supported on a first carrier 128 located on a side of the second wafer 120 opposite the first wafer 100. For example, a temporary bonding material 136 may be located on the second backside surface 130, may at least partially surround the second electrically conductive elements 134 on the second backside surface 130, and may temporarily secure the second wafer 120 to the first carrier 128, which may support and reinforce the second wafer 120 during processing and handling. The second wafer 120 may have a third thickness $T_3$ smaller than the first thickness $T_1$ of the first wafer 100, which may represent a final, thinned state of the second wafer 120, for example between about 40 μm and about 70 μm.

First ends 118 of the first electrically conductive elements 110 located distal from the first active surface 104 may be operatively connected to the second vias 122 at the second active surface 126 of the second wafer 120, such as, for example, by aligning the first electrically conductive elements 110 with the second vias 122 and contacting the first electrically conductive elements 110 to the bond pads 132. Force may be applied to the first wafer 100, the second wafer 120, and the first carrier 128 while exposing the first wafer 100, the second wafer 120, and the first carrier 128 to an elevated temperature sufficient to reflow the first electrically conductive elements 110. Reflowing the solder caps of the first electrically conductive elements 110 may cause the first electrically conductive elements 110 to successfully connect operatively, electrically, and mechanically to the second vias 122 (e.g., by way of the bond pads 132). It should be noted that a similar techniques may be employed to diffusion bond copper pillars lacking solder caps to bond pads. Application of force and exposure to elevated temperature may be accomplished by, for example, subjecting the first wafer 100, the second wafer 120, and the first carrier 128 to a thermocompression bonding process. More specifically, application of force and exposure to elevated temperature may be accomplished by placing the first wafer 100, the second wafer 120, and the first carrier 128 in a container, reducing ambient pressure in the interior of the container to at least a partial vacuum, and placing the container and its contents in a furnace. The applied force may be, for example, between about 2 kN and about 12 kN. More specifically, the applied force may be between about 2.5 kN and about 10 kN. As a specific, nonlimiting example, the applied force may be between about 3 kN and about 8 kN (e.g., about 3.5 kN, about 4 kN, about 4.5 kN, or about 5 kN). The elevated temperature may be, for example, between about 215° C. and about 300° C. More specifically, the elevated temperature may be, for example, between about 225° C. and about 275° C. As a specific, nonlimiting example, the elevated temperature may be between about 240° C. and about 260° C. (e.g., about 245° C., about 250° C., or about 255° C.).

In response to application of force and exposure to elevated temperature, portions of the first quantity of the dielectric material 116 may flow into the first trenches 112. For example, the first quantity of the dielectric material 116 may become flowable, if applied as an NCF, or remain in a flowable state if applied by spin coating, and the applied force and exposure to elevated temperature may squeeze the first wafer 100 and the second wafer 120 toward one another, reducing the distance and thus the volume, between the first wafer 100 and the second wafer 120, and reducing the second thickness $T_2$ of the first quantity of the dielectric material 116 between the first wafer 100 and the second wafer 120. Portions of the dielectric material 116 may flow into, and at least substantially fill, the first trenches 112 in response to the reduction in volume between the first wafer 100 and the second wafer 120. For example, voids in the first trenches 112 containing environmental fluid (e.g., air or an inert gas, such as argon) may be at least substantially removed, being replaced by the dielectric material 116. After reflowing the solder caps of the first electrically conductive elements 110 and causing the dielectric material 116 to flow into the first trenches 112, the first electrically conductive elements 110 and the first quantity of the dielectric material 116, in addition to other components, such as the first wafer 100, second wafer 120, and first carrier 128, may be permitted to cool. Cooling may cause the reflowed solder of the first electrically conductive elements 110 to solidify, forming mechanical and electrical connections to the second vias 122, and the dielectric material 116 to solidify, providing electrical isolation between the first wafer 100 and the second wafer 120, and between the first electrically conductive elements 110. In some embodiments, application of heat to, and subsequent cooling of, the dielectric material 116 may cause the dielectric material 116 to cure.

Figure 5:
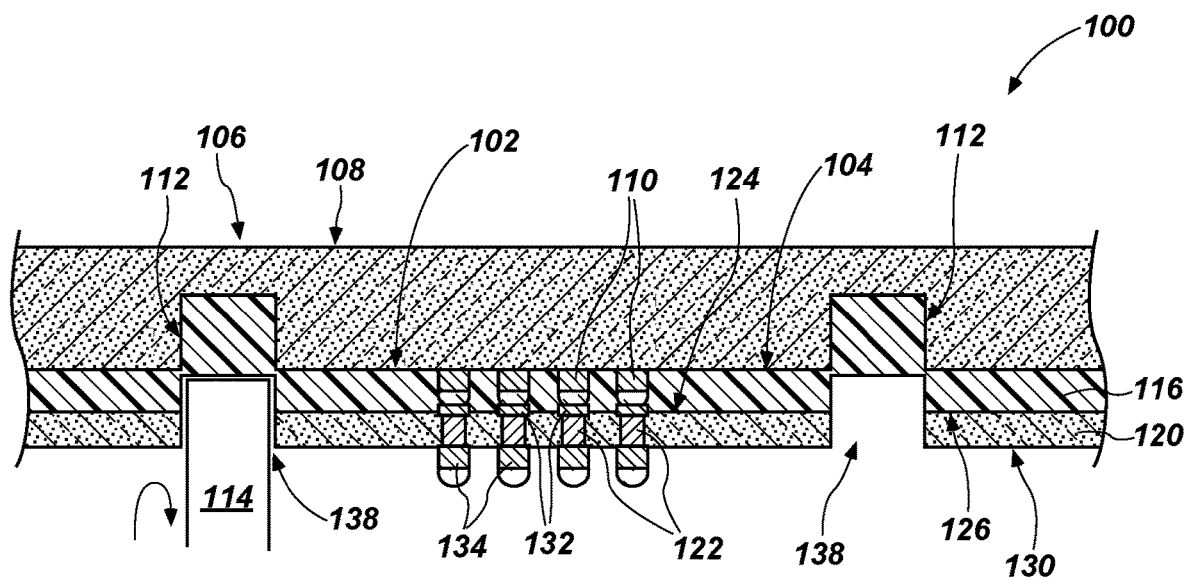
FIG. 5 is a cross-sectional side view of the portion of the wafer of FIG. 4 during a fourth stage in the process of fabricating semiconductor device packages.

FIG. 5 is a cross-sectional side view of the portion of the first wafer 100 of FIG. 4 during a fourth stage in the process of fabricating semiconductor device packages. After the second wafer 120 has been mechanically and electrically connected to the first wafer 100, the first carrier 128 (see FIG. 4) may be removed from the second wafer 120. For example, the first carrier 128 (see FIG. 4) may be removed by weakening the temporary bonding material 136 (e.g., by application of heat, exposure to ultraviolet light, or exposure to a solvent material). The first carrier 128 (see FIG. 4) may then be displaced relative to the second wafer 120 (e.g., by sliding in a direction parallel to the second active surface 126, or peeling first carrier 128 away from the second wafer from one side to another).

Second trenches 138 aligned with the first streets 106 may be formed by, for example, removing semiconductor material of the second wafer 120 through an entirety of the third thickness $T_3$ and partially into the dielectric material 116 located between the first wafer 100 and the second wafer 120. For example, the first dicing saw 114 may again be used, and the first dicing saw 114 may cut entirely through the second wafer 120 and partially through the first quantity of the dielectric material 116 in the space between the first wafer 100 and the second wafer 120. Removing the semiconductor material of the second wafer 120 through the entirety of the third thickness $T_3$ may singulate the respective second regions 124 of integrated circuitry from one another, forming discrete second semiconductor dice 172.

The discrete second semiconductor dice 172 may still be referred to collectively in this disclosure as the second wafer 120 for ease of description. The second trenches 138 may have at least substantially the same sizes and shapes described previously in connection with the first trenches 112. In some embodiments, the second trenches 138 may be at least substantially the same size and shape as the first trenches 112. In other embodiments, the second trenches 138 may have a different size, shape, or size and shape from the first trenches 112, though still within the location parameters described previously.

Figure 6:
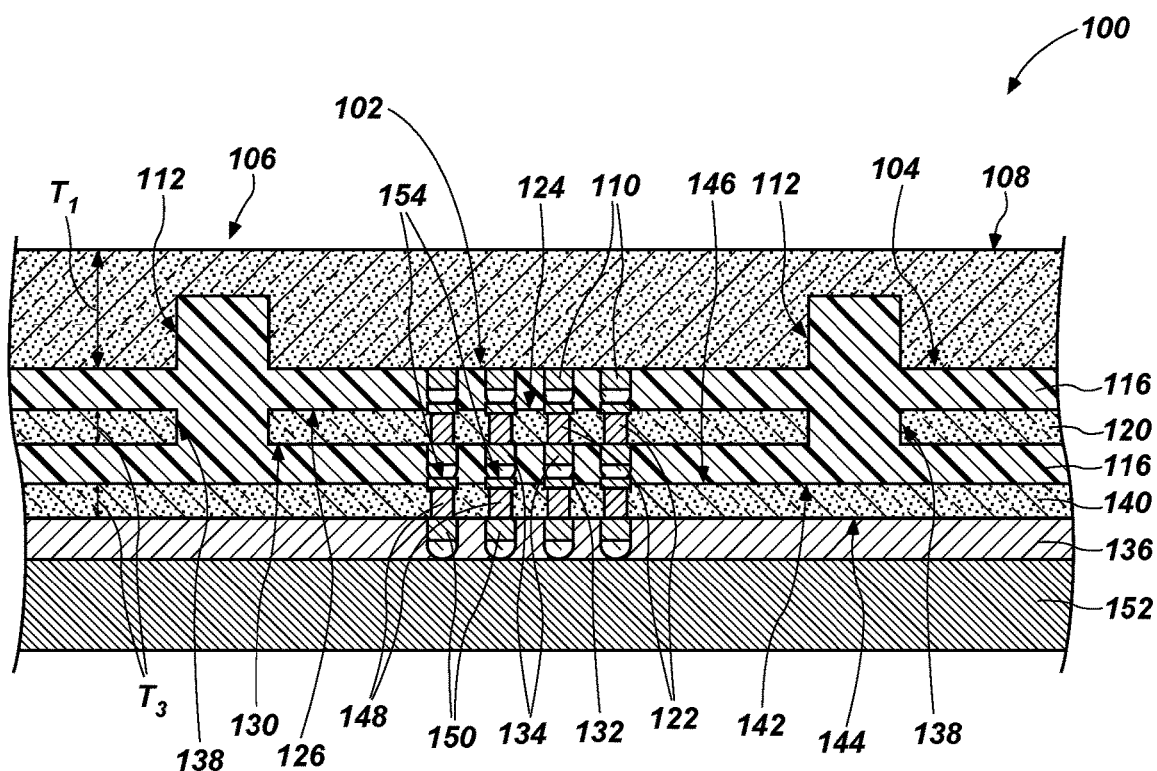
FIG. 6 is a cross-sectional side view of the portion of the wafer of FIG. 5 during a fifth stage in the process of fabricating semiconductor device packages.

FIG. 6 is a cross-sectional side view of the portion of the first wafer 100 of FIG. 5 during a fifth stage in the process of fabricating semiconductor device packages. A second quantity of the dielectric material 116 may be placed in contact with the second backside surface 130 of the second wafer 120, at least partially surrounding the second electrically conductive elements 134 located on the second backside surface 130 with the dielectric material 116. The second quantity of the dielectric material 116 may be in the form of a material described previously in connection with the first quantity of the dielectric material 116, and may be placed in position by any of the techniques described previously in connection with the first quantity of the dielectric material 116. In some embodiments, the dielectric material 116 of the first and second quantities may be the same material. In other embodiments the dielectric material 116 of the first quantity may be different from the dielectric material 116 of the second quantity.

A third wafer 140 comprising a semiconductor material may be brought proximate to, and placed in contact with, the second quantity of the dielectric material 116 on a side of the dielectric material 116 opposite the second wafer 120. The third wafer 140 may generally be configured in a manner similar to the first wafer 100, including having a third active surface 142 facing the second backside surface 130 of the second wafer 120 and a third backside surface 144 located on a side of the third wafer 140 opposite the third active surface 142, the first wafer 100, and the second wafer 120. The third active surface 142 may include discrete, third regions 146 of integrated circuitry embedded within, and distributed across, the third active surface 142. The third regions 146 of integrated circuitry may be operatively, electrically connected to third vias 148 extending from at least proximate to the third active surface 142, through semiconductor material of the third wafer 140 in a direction at least substantially perpendicular to the third active surface 142, to at least proximate to the third backside surface 144. The third wafer 140 may enable electrical and operative connection to the third regions 146 of integrated circuitry, and between the third active surface 142 and the third backside surface 144 utilizing, for example, bond pads 132 connected to the third vias 148 at the third active surface 142 and third electrically conductive elements 150 positioned on, and extending outward from, the third vias 148 at the third backside surface 144.

The third wafer 140 may be supported on a second carrier 152 located on a side of the third wafer 140 opposite the second wafer 120. For example, a temporary bonding material 136 may be located on the third backside surface 144, may at least partially surround the third electrically conductive elements 150 on the third backside surface 144, and may temporarily secure the third wafer 140 to the second carrier 152, which may support and reinforce the third wafer 140 during processing and handling. The third wafer 140 may have the third thickness $T_3$ smaller than the first thickness $T_1$ of the first wafer 100, which may represent a final, thinned state of the third wafer 140, for example between about 40 μm and about 70 μm.

Second ends 154 of the second electrically conductive elements 134 located distal from the second active surface 126 may be operatively connected to the third vias 148 at the third active surface 142 of the third wafer 140, such as, for example, by aligning the second electrically conductive elements 134 with the third vias 148 and contacting the second electrically conductive elements 134 to the bond pads 132. Force may be applied to the first wafer 100, the second wafer 120, the third wafer 140, and the second carrier 152 while exposing the first wafer 100, the second wafer 120, the third wafer 140, and the second carrier 152 to an elevated temperature sufficient to reflow the solder caps of the second electrically conductive elements 134. Reflowing the solder caps of the second electrically conductive elements 134 may cause the second electrically conductive elements 134 to successfully connect operatively, electrically, and mechanically to the third vias 148 (e.g., by way of the bond pads 132). Application of force and exposure to elevated temperature may be accomplished by, for example, subjecting the first wafer 100, the second wafer 120, the third wafer 140, and the second carrier 152 to a thermocompression bonding process, as described previously in connection with FIG. 4.

In response to application of force and exposure to elevated temperature, portions of the second quantity of the dielectric material 116 may flow into the second trenches 138. For example, the second quantity of the dielectric material 116, depending on the nature thereof, may be caused to become flowable or may remain in a flowable state, and the applied force and exposure to elevated temperature may squeeze the second wafer 120 and the third wafer 140 toward one another, reducing the distance and thus the volume between the second wafer 120 and the third wafer 140. Portions of the dielectric material 116 may flow into, and at least substantially fill, the second trenches 138 in response to the reduction in space between the second wafer 120 and the third wafer 140. For example, voids in the second trenches 138 containing environmental fluid (e.g., air or an inert gas, such as argon) may be at least substantially removed, being replaced by the dielectric material 116. After reflowing the second electrically conductive elements 134 and causing the dielectric material 116 to flow into the second trenches 138, the second electrically conductive elements 134 and the second quantity of the dielectric material 116, in addition to other components, such as the first wafer 100, second wafer 120, third wafer 140, and second carrier 152, may be permitted to cool. Cooling may cause the solder of the second electrically conductive elements 134 to solidify, forming mechanical and electrical connections to the third vias 148, and the dielectric material 116 to solidify, providing electrical isolation between the second wafer 120 and the third wafer 140, and between the second electrically conductive elements 134. In some embodiments, application of heat to, and subsequent cooling of, the dielectric material 116 may cause the dielectric material 116 to cure.

At least the first wafer 100 and second wafer 120, and optionally the third wafer 140 and any additional wafers, may collectively form a stack, which may be expanded or maintained at just two wafers, depending on the intended application and configuration for the integrated circuitry of the various wafers. For example, a number of wafers in the stack may be between two (i.e., just the first wafer 100 and the second wafer 120) and sixteen. More specifically, the number of wafers in the stack may be between four and eight (e.g., may be exactly four or exactly eight). To form the stack, the acts of FIGS. 5 and 6 may be repeated, including forming additional trenches that singulate a most-recently added wafer in situ, adding dielectric material, contacting another wafer, and reflowing electrically conductive elements and flowing the dielectric material into the trench, until the total number of wafers in the stack reaches a desired final number.

Figure 7:
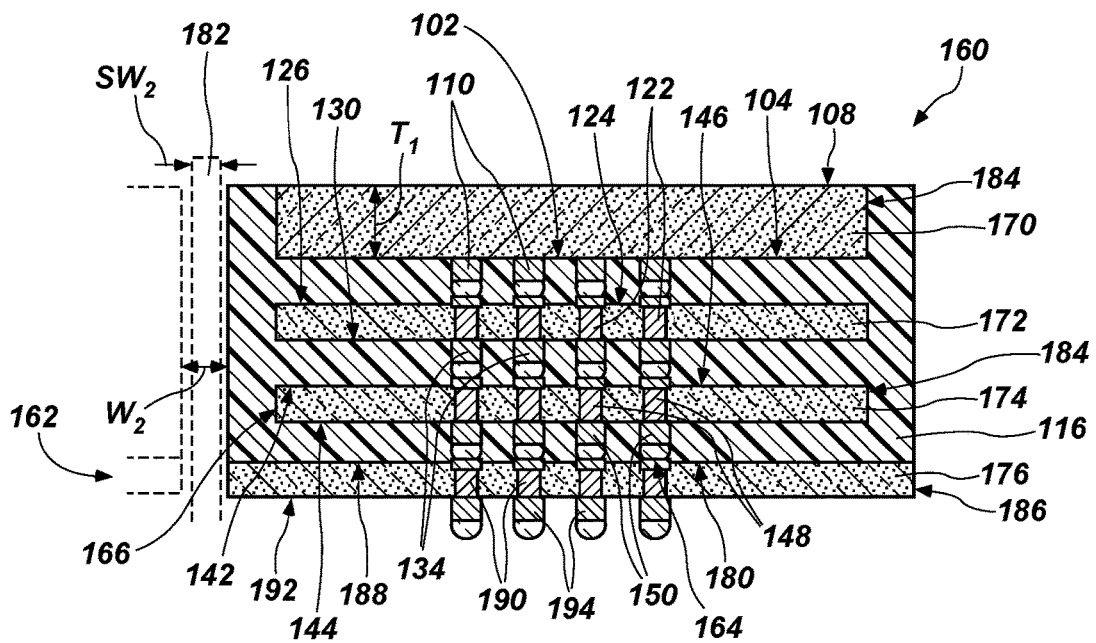
FIG. 7 is a cross-sectional side view of a semiconductor device package fabricated in accordance with this disclosure.

FIG. 7 is a cross-sectional side view of a semiconductor device package 160 produced in accordance with this disclosure. To form the semiconductor device package 160 shown in FIG. 7, the second carrier 152 (see FIG. 6) may be removed from the third wafer 140. Third trenches 166 aligned with the first streets 106 may be formed by, for example, removing semiconductor material of the third wafer 140 through an entirety of the third thickness $T_3$ and partially into the dielectric material 116 located between the second wafer 120 and the third wafer 140. A third quantity of the dielectric material 116 may be placed in contact with the third backside surface 144 of the third wafer 140. A fourth wafer 162 comprising a semiconductor material may be brought proximate to, and placed in contact with, the third quantity of the dielectric material 116 on a side of the dielectric material 116 opposite the third wafer 140. The fourth wafer 162 may be supported on a third carrier (not shown) and may have the third thickness $T_3$ smaller than the first thickness $T_1$ of the first wafer 100, which may represent a final, thinned state of the third wafer 140, for example between about 40 μm and about 70 μm.

Third ends 164 of the third electrically conductive elements 150 located distal from the third active surface 142 may be operatively connected to fourth vias 190 at the fourth active surface 188 of the fourth wafer 162. Force may be applied to the first wafer 100, the second wafer 120, the third wafer 140, the fourth wafer 162, and the third carrier while exposing the first wafer 100, the second wafer 120, the third wafer 140, the fourth wafer 162, and the third carrier to an elevated temperature sufficient to reflow the solder caps of the third electrically conductive elements 150. In response to application of force and exposure to elevated temperature, portions of the third quantity of the dielectric material 116 may flow into the third trenches 166. After reflowing the solder of the third electrically conductive elements 150 and causing the dielectric material 116 to flow into the third trenches 166, the second electrically conductive elements 134 and the second quantity of the dielectric material 116, in addition to other components, such as the first wafer 100, second wafer 120, third wafer 140, and second carrier 152, may be permitted to cool. No additional trenches may be formed through the fourth wafer 162 in embodiments where the fourth wafer 162 is the bottom-most, furthest wafer from the first wafer 100.

The first thickness $T_1$ of the first wafer 100 may be reduced from a side of the first wafer 100 opposite the second wafer 120 and revealing the portions of the dielectric material 116 in the first trenches 112. For example, semiconductor material of the first wafer 100 may be removed from the first backside surface 108 at least until the first thickness $T_1$ of the first wafer 100 is equal to the depth D of the first trenches 112, and may optionally be continued until the first thickness $T_1$ of the first wafer 100 is less than the depth D of the first trenches 112 after initial formation. Reduction of the first thickness $T_1$ may be accomplished, for example, by one or more of backgrinding, etching (e.g., dry or wet etching) or chemical mechanical planarization of the first wafer 100. Reducing the first thickness $T_1$ of the first wafer 100 in this manner may also singulate the respective first regions 102 of integrated circuitry from one another, forming discrete first semiconductor dice 170.

The first regions 102 of integrated circuitry may be separated from one another, the second regions 124 of integrated circuitry may be separated from one another, the third regions 146 of integrated circuitry may be separated from one another, and fourth regions 180 of integrated circuitry of the fourth wafer 162 may be separated from one another to form semiconductor device packages. For example, singulation may be accomplished by cutting through the portions of the dielectric material 116 in the first trenches 112, second trenches 138, and third trenches 166 to physically separate the first dice 170, second dice 172, and third dice 174 from the first wafer 100, second wafer 120, and third wafer 140. Singulation may also involve cutting through portions of the fourth wafer 162 aligned with the first streets 106, forming fourth dice 176. As specific, nonlimiting examples, singulation may occur by cutting through the dielectric material 116 and the fourth wafer 162 utilizing a second dicing saw 182 having a second saw width $SW_2$ less than the first saw width $SW_1$ of the first dicing saw 114 (see FIG. 2), or by performing a second, different number of dicing passes utilizing the first dicing saw 114 (see FIG. 2) or second dicing saw 182 sufficient to form separation gaps of a second width smaller than the first width $W_1$ (see FIG. 2). As a result, portions of the dielectric material 116 may remain on side surfaces 184 of the first dice 170, second dice 172, and third dice 174, and the side surfaces 186 of the fourth dice 176 may be free of the dielectric material 116. In addition, the fourth dice 176 may extend laterally beyond the lateral peripheries of the first dice 170, second dice 172, and third dice 174 formed by the side surfaces 184. The third carrier may be removed from the fourth wafer 162.

As illustrative embodiments within the scope of this disclosure, methods of fabricating semiconductor device packages may involve forming trenches in streets between first regions of integrated circuitry in a first active surface of a first wafer. A dielectric material may be placed over the first active surface. Ends of electrically conductive elements protruding from the first active surface may be placed proximate bond pads operatively connected to second regions of integrated circuitry at a second active surface of a second wafer with the dielectric material interposed between the first active surface and the second active surface. Force may be applied perpendicular to the first wafer and the second wafer while exposing the first wafer and the second wafer to an elevated temperature sufficient to cause the electrically conductive elements to contact the bond pads. Portions of the dielectric material may flow into the trenches during application of the force. The elevated temperature may be reduced to connect the electrically conductive elements to the bond pads and at least partially solidify the dielectric material. A thickness of the first wafer may be reduced from a side of the first wafer opposite the second wafer to reveal the portions of the dielectric material in the trenches. The first regions of integrated circuitry may be separated from one another and the second regions of integrated circuitry may be separated from one another to form singulated semiconductor dice by removing portions of the dielectric material in the trenches and leaving portions of the dielectric material covering sidewalls of the singulated semiconductor dice.

As additional, illustrative embodiments within the scope of this disclosure, methods of fabricating semiconductor device packages may involve forming trenches in streets between first regions of integrated circuitry of a first active surface of a first semiconductor wafer by cutting partially through the first semiconductor wafer. Dielectric material may be placed in contact with the first active surface at least partially surrounding first electrically conductive elements located on the first active surface. Ends of the first electrically conductive elements to bond pads connected to second regions of integrated circuitry at a second active surface of a second semiconductor wafer with the dielectric material between the first semiconductor wafer and the second semiconductor wafer while the second semiconductor is wafer supported on a first carrier located on a side of the second wafer opposite the first wafer. Force may be applied to the first wafer, the second wafer, and the first carrier while exposing the first wafer, the second wafer, and the first carrier to an elevated temperature sufficient to reflow portions of the first electrically conductive elements. Portions of the first quantity of the dielectric material may flow into the first trenches. The first electrically conductive elements and the dielectric material may between the first semiconductor wafer and the second semiconductor wafer may be permitted to cool. The second carrier may be removed. Second trenches aligned with the streets may be formed by cutting entirely through the second wafer and partially into the dielectric material. Dielectric material may be placed in contact with a second backside surface of the second wafer located on a side of the second wafer opposite the second active surface, at least partially surrounding second electrically conductive elements located on the second backside surface and electrically connected to vias of the second semiconductor wafer with the dielectric material. Ends of the second electrically conductive elements may be operatively connected to vias connected to third regions of integrated circuitry of a third active surface of a third semiconductor wafer with dielectric material interposed between the second semiconductor wafer and the third semiconductor wafer while the third wafer is supported on a second carrier located on a side of the third wafer opposite the second wafer. Force may be applied to the first wafer, the second wafer, the third wafer, and the second carrier while exposing the first wafer, the second wafer, the third wafer, and the second carrier to an elevated temperature sufficient to reflow portions of the second electrically conductive elements. Portions of the dielectric material may flow into the second trenches. The second electrically conductive elements and the second quantity of the dielectric material located between the second semiconductor wafer and the third semiconductor wafer may be permitted to cool. A thickness of the first semiconductor wafer may be reduced from a side of the first semiconductor wafer opposite the second semiconductor wafer and revealing the portions of the dielectric material in the trenches. The second carrier may be removed. The first regions of integrated circuitry may be separated from one another and the second regions of integrated circuitry may be separated from one another at least partially by cutting through portions of the dielectric material in the trenches.

As shown in FIG. 7, semiconductor device packages 160 produced in accordance with this disclosure may include a first, top-most die 170 having a first backside surface 108 lacking integrated circuitry therein exposed at an exterior of the semiconductor device packages 160. A first active surface 104 located on a side of the first die 170 opposite the first backside surface 108 and having integrated circuitry therein may be covered with a dielectric material 116, which may extend contiguously from under the first active surface 104 to cover side surfaces 184 of the first die 170 extending between the first active surface 104 and the first backside surface 108. The dielectric material 116 may be at least substantially flush with the first backside surface 108 at the exterior of the semiconductor device package 160.

At least a second, intermediate die 172 may be located proximate to the first active surface 104 of the first die 170 such that the dielectric material 116 is interposed between the first die 170 and the second die 172. First electrically conductive elements 110 may extend from the first active surface 104 of the first die 170 to a second active surface 126 of the second die 172 having integrated circuitry therein and facing the first active surface 104 of the first die 170. The first electrically conductive elements 110 may be operatively connected to second vias 122 extending between the second active surface 126 and a second backside surface 130 of the second die 172 located on a side of the second die 172 opposite the first die 170. The second backside surface 130 may be covered with the dielectric material 116, which may extend contiguously from under the second backside surface 130 to cover side surfaces 184 of the second die 172 extending between the second active surface 126 and the second backside surface 130. As shown in FIG. 7, additional intermediate dice, such as the third die 174, may be located on a side of the second die 172 opposite the first die 170, and electrically conductive elements of an immediately overlying die, such as the second electrically conductive elements 134 of the second die 172, may be operatively connected to complementary vias of the underlying intermediate die, such as the third vias 148 of the third die 174. The backside surfaces of the intermediate dice, such as the third backside surface 144 of the third die 174, may be covered by the dielectric material 116, which may extend contiguously from under the respective backside surface to cover side surfaces 184 of the respective die.

A bottom-most die, which in FIG. 7 is the fourth die 176, may be located proximate to the backside surface of the immediately overlying die, such as the third backside surface 144 of the third die 174, such that the dielectric material 116 is interposed between the immediately overlying die and the bottom-most die. Overlying electrically conductive elements may extend from the backside surface of the overlying die to a bottom-most active surface of the bottom-most die, such as the fourth active surface 188 of the fourth die 176. The overlying electrically conductive elements may be operatively connected to bottom-most vias extending between the bottom-most active surface and a bottom-most backside surface of the bottom-most die, such as the fourth vias 190 extending between the fourth active surface 188 and a fourth backside surface 192. The bottom-most backside surface may be exposed, and bottom-most electrically conductive elements operatively connected to the bottom-most or fourth vias 190 may extend from the bottom-most backside surface for electrical, mechanical, and operative connection to another device or structure, such as the fourth electrically conductive elements 194 located on the fourth backside surface 192. The bottom-most or fourth die 176 may extend laterally beyond the lateral peripheries of the overlying dice in the stack, such that the side surfaces 186 of the bottom-most or fourth die 176 may be exposed at the exterior of the semiconductor device package 160. The dielectric material 116 covering the side surfaces 184 of the overlying dice may cover the lateral periphery of the bottom-most active surface, in FIG. 7 covering the lateral periphery of the fourth active surface 188 of the fourth die 176 extending beyond the lateral peripheries of semiconductor dice 170, 172 and 174.

While the semiconductor device package 160 of the present disclosure has been described in terms of the second and third semiconductor dice 172 and 174 between first semiconductor die 170 and semiconductor die 176 as having active surfaces facing first semiconductor die 170, second and third semiconductor dice 172 and 174 may be oriented with active surfaces facing away from first die 170. Similarly semiconductor die 176 may be oriented with an active surface facing away from first semiconductor die 170, so that the active surfaces of all dice in the package are similarly oriented. Of course, suitable passivation material would be applied to the exposed active surface to protect the integrated circuitry thereon, as is known in the art.

In some embodiments, the semiconductor device package 160 may be configured as a memory module. For example, the bottom-most semiconductor die, or the fourth die 176 in FIG. 7, may be configured as a logic die for controlling operating of the memory module and communicating with other operatively connected devices, and the overlying dice, or the first die 170, second die 172, and third die 174 in FIG. 7, may be configured as memory dice for storing data. Semiconductor device packages 160 fabricated at the wafer level may be fabricated in a less costly, more rapid manner than conventional, multi-die packages such as so-called hybrid memory cubes, and with higher yields.

As illustrative embodiments in accordance with this disclosure, semiconductor device packages may include a bottom-most semiconductor die comprising external electrically conductive elements located on a backside surface thereof, the external electrically conductive elements electrically connected to vias extending from the backside surface to an active surface comprising integrated circuitry and located on a side of the bottom-most semiconductor die opposite the backside surface. At least one intermediate semiconductor die stacked over the bottom-most semiconductor die, each intermediate semiconductor die comprising electrically conductive elements located on a backside surface of the respective at least one intermediate semiconductor die, the electrically conductive elements electrically connected to vias extending from the backside surface to an active surface comprising integrated circuitry and located on a side of the respective intermediate semiconductor die opposite the backside surface thereof and to the bond pads of an underlying intermediate semiconductor die or the bottom-most die. A top-most semiconductor die located on a side of a farthest intermediate semiconductor die from the bottom-most semiconductor die opposite the bottom-most semiconductor die, the top-most semiconductor die comprising a semiconductor material and electrically conductive elements located on an active surface of the top-most die comprising integrated circuitry, the electrically conductive elements of the top-most semiconductor die electrically connected to bond pads of the farthest intermediate semiconductor die from the bottom-most semiconductor die, the active surface of the top-most semiconductor die facing toward the bottom-most semiconductor die, wherein the bottom-most semiconductor die extends beyond lateral peripheries of each intermediate semiconductor die and the top-most semiconductor die. A dielectric material may be located between each of the semiconductor dice, at least sections of the dielectric material extending contiguously from between adjacent semiconductor dice, laterally beyond the lateral peripheries all but the bottom-most semiconductor die and over sidewalls thereof.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A method of fabricating a semiconductor device package, comprising:
    forming trenches in streets between first regions of integrated circuitry in a first active surface of a first wafer;
    placing a dielectric material over the first active surface;
    placing ends of electrically conductive elements protruding from the first active surface proximate bond pads operatively connected to second regions of integrated circuitry at a second active surface of a second wafer with the dielectric material interposed between the first active surface and the second active surface;
    applying force perpendicular to the first wafer and the second wafer while exposing the first wafer and the second wafer to an elevated temperature sufficient to cause the electrically conductive elements to contact the bond pads;
    flowing portions of the dielectric material into the trenches during application of the force;
    reducing the elevated temperature to at least partially solidify the dielectric material;
    reducing a thickness of the first wafer from a side of the first wafer opposite the second wafer to reveal the portions of the dielectric material in the trenches; and
    separating the first regions of integrated circuitry from one another and the second regions of integrated circuitry from one another to form singulated semiconductor dice by removing a first part of the portions of the dielectric material in the trenches and leaving a second part of the portions of the dielectric material covering sidewalls of the singulated semiconductor dice.

2. The method of claim 1, further comprising supporting the second wafer on a carrier before connecting the ends of the electrically conductive elements to the bond pads of the second wafer.

3. The method of claim 2, wherein supporting the second wafer on the carrier comprises contacting a second backside surface of the second wafer located on a side of the second wafer opposite the second active surface to the carrier with a temporary bonding material and at least partially surrounding second electrically conductive elements located on the second backside surface and electrically connected to vias of the second wafer with the temporary bonding material and further comprising removing the carrier after the electrically conductive elements are connected to the bond pads and the dielectric material is in a substantially solid state.

4. The method of claim 1, further comprising, before reducing the thickness of the first wafer, forming other trenches aligned with the streets, the other trenches extending through the second wafer and into the dielectric material located between the first wafer and the second wafer.

5. The method of claim 4, further comprising, before reducing the thickness of the first wafer:
    placing a second quantity of the dielectric material over a second backside surface of the second wafer located on a side of the second wafer opposite the second active surface, at least partially surrounding second electrically conductive elements located on the second backside surface and electrically connected to vias of the second wafer with the second quantity of the dielectric material;

operatively connecting ends of the second electrically conductive elements distal from the second backside surface to bond pads operatively connected to third regions of integrated circuitry at a third active surface of a third wafer, the second quantity of the dielectric material interposed between the second backside surface and the third active surface;

applying force perpendicular to the first wafer, the second wafer, and the third wafer while exposing the first wafer, the second wafer, and the third wafer to the elevated temperature to cause the second electrically conductive elements to contact the bond pads of the third wafer;

flowing portions of the second quantity of the dielectric material into the other trenches during the application of perpendicular force; and reducing the elevated temperature to at least partially solidify the second quantity of the dielectric material.

6. The method of claim 5, further comprising supporting the third wafer on a carrier before connecting the ends of the second electrically conductive elements to vias of the third wafer.

7. The method of claim 6, wherein supporting the third wafer on the carrier comprises contacting a third backside surface of the third wafer located on a side of the third wafer opposite the third active surface to the carrier with a temporary bonding material and at least partially surrounding third electrically conductive elements located on the third backside surface and electrically connected to the vias of the third wafer with the temporary bonding material and further comprising removing the carrier after the second electrically conductive elements are connected and the second quantity of the dielectric material is in a substantially solid state.

8. The method of claim 1, wherein placing the dielectric material over the first active surface comprises placing a nonconductive film over the first active surface.

9. The method of claim 1, wherein applying the perpendicular force to the first wafer and the second wafer while exposing the first wafer and the second wafer to the elevated temperature sufficient to reflow the electrically conductive elements comprises subjecting the first wafer and the second wafer to a thermocompression bonding process.

10. The method of claim 1, wherein forming the trenches in the streets of the first wafer comprises utilizing a saw to cut partially through the first wafer.

11. The method of claim 1, wherein forming the trenches in the streets between the first regions of integrated circuitry of the first wafer comprises forming the trenches in the streets between the first regions of integrated circuitry, the first regions of integrated circuitry comprising memory devices, of the first wafer and wherein separating the first regions of integrated circuitry from one another and the second regions of integrated circuitry from one another comprises separating the first regions of integrated circuitry from one another and the second regions of integrated circuitry from one another in such a way that farthest regions of integrated circuitry from the first regions of integrated circuitry comprise logic devices and any intervening regions of integrated circuitry between the first regions of integrated circuitry and the farthest regions of integrated circuitry comprise memory devices.

12. The method of claim 1, wherein applying the perpendicular force to the first wafer and the second wafer further comprises applying at least a partial vacuum to an interior of a container in which the first wafer and the second wafer are located.

13. The method of claim 1, wherein applying perpendicular force to the first wafer and the second wafer comprises applying between 2 kN and 12 kN of force to the first wafer and the second wafer.

14. The method of claim 1, wherein exposing the first wafer and the second wafer to the elevated temperature comprises exposing the first wafer and the second wafer to a temperature of between about 215° C. and about 300° C.

15. A method of fabricating a semiconductor device package, comprising:

forming first trenches in streets between first regions of integrated circuitry of a first active surface of a first semiconductor wafer by cutting partially through the first semiconductor wafer;

placing a first quantity of a dielectric material in contact with the first active surface at least partially surrounding first electrically conductive elements located on the first active surface;

operatively connecting ends of the first electrically conductive elements to bond pads connected to second regions of integrated circuitry at a second active surface of a second semiconductor wafer with the first quantity of the dielectric material between the first semiconductor wafer and the second semiconductor wafer while the second semiconductor is wafer supported on a first carrier located on a side of the second semiconductor wafer opposite the first semiconductor wafer;

applying force to the first semiconductor wafer, the second semiconductor wafer, and the first carrier and reflowing portions of the first electrically conductive elements;

flowing portions of the first quantity of the dielectric material into the first trenches;

permitting the first electrically conductive elements and the first quantity of the dielectric material to cool;

removing the first carrier;

forming second trenches aligned with the streets by cutting entirely through the second semiconductor wafer and partially into the first quantity of the dielectric material;

placing a second quantity of the dielectric material in contact with a second backside surface of the second semiconductor wafer located on a side of the second semiconductor wafer opposite the second active surface, at least partially surrounding second electrically conductive elements located on the second backside surface and electrically connected to vias of the second semiconductor wafer with the second quantity of the dielectric material;

operatively connecting ends of the second electrically conductive elements to vias connected to third regions of integrated circuitry of a third active surface of a third semiconductor wafer with the second quantity of the dielectric material interposed between the second semiconductor wafer and the third semiconductor wafer while the third semiconductor wafer is supported on a second carrier located on a side of the third semiconductor wafer opposite the second semiconductor wafer;

applying force to the first semiconductor wafer, the second semiconductor wafer, the third semiconductor wafer, and the second carrier and reflowing portions of the second electrically conductive elements;

flowing portions of the second quantity of the dielectric material into the second trenches;

permitting the second electrically conductive elements and the second quantity of the dielectric material to cool;

reducing a thickness of the first semiconductor wafer from a side of the first semiconductor wafer opposite the second semiconductor wafer and revealing the portions of the first quantity of the dielectric material in the first trenches;

removing the second carrier; and separating the first regions of integrated circuitry from one another, the second regions of integrated circuitry from one another, and the third regions of integrated circuitry from one another at least partially by cutting through portions of the first and second quantities of the dielectric material in the trenches.

16. The method of claim 15, further comprising separating the third regions of integrated circuitry from one another by cutting through an entire thickness of the third semiconductor wafer.

17. The method of claim 15, wherein forming the first trenches in the streets of the first semiconductor wafer and forming the second trenches aligned with the streets by cutting entirely through the second semiconductor wafer and partially into the first quantity of the dielectric material comprises utilizing a saw.

18. The method of claim 17, wherein separating the first regions of integrated circuitry from one another, the second regions of integrated circuitry from one another, and the third regions of integrated circuitry from one another comprises cutting through the portions of the first quantity and the second quantity of the dielectric material in the trenches and a farthest semiconductor wafer from the first semiconductor wafer utilizing another saw having a blade width less than a width of the saw used to form the first trenches and the second trenches.

19. The method of claim 15, wherein reducing the thickness of the first semiconductor wafer comprises at least one of back-grinding the first semiconductor wafer, etching the first semiconductor wafer and chemical mechanical polishing the first semiconductor wafer.

* * * * *